United States Patent [19]

Sasaki

[11] 4,030,041

[45] June 14, 1977

[54] ANALOG ISOLATOR

[75] Inventor: Toshihiko Sasaki, Chigasaki, Japan

[73] Assignee: Honeywell Inc., Minneapolis, Minn.

[22] Filed: Aug. 28, 1975

[21] Appl. No.: 608,726

[52] U.S. Cl. .................................. 330/10; 330/59
[51] Int. Cl.² ......................................... H03F 3/38
[58] Field of Search ............... 330/9, 10, 59, 207 A

[56] References Cited

UNITED STATES PATENTS

| 3,656,065 | 4/1972 | Reinhard et al. | 330/10 |
| 3,913,001 | 10/1975 | Kayama | 330/10 X |

FOREIGN PATENTS OR APPLICATIONS

| 42-29847 | 10/1967 | Japan | 330/10 |
| 158,220 | 3/1962 | U.S.S.R. | 330/10 |

Primary Examiner—James B. Mullins
Attorney, Agent, or Firm—Laurence J. Marhoefer; Lockwood D. Burton

[57] ABSTRACT

An analog isolator includes a circuit wherein a power transformer has a primary winding for connection to an A.C. source, a first and second power take-off secondary windings and a first and second signal secondary windings. The A.C. signal of the first signal secondary winding is compared with an input signal to provide cross-over pulses. Those pulses are applied to control an isolator device such as a photocoupler. The output signal from the photocoupler is applied as gate control signals to control the selective gating of the signals from the second signal secondary winding. The selectively gated signals are applied either to a sample-and-hold arrangement or to an integrating smoothing circuit to provide effectively a reconstruction of the input signal but conductively isolated from the input circuit.

4 Claims, 7 Drawing Figures

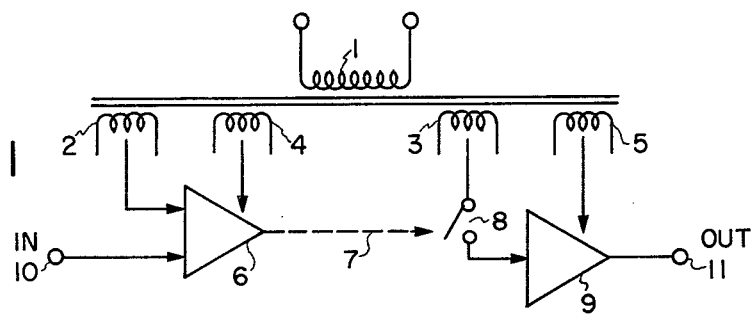
FIG. 1
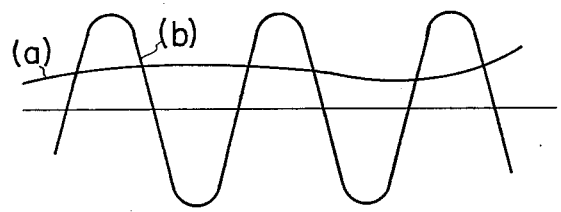
FIG. 2A
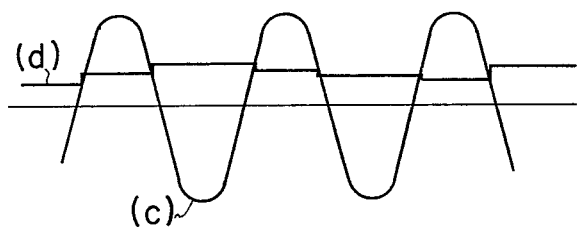
FIG. 2B
FIG. 3

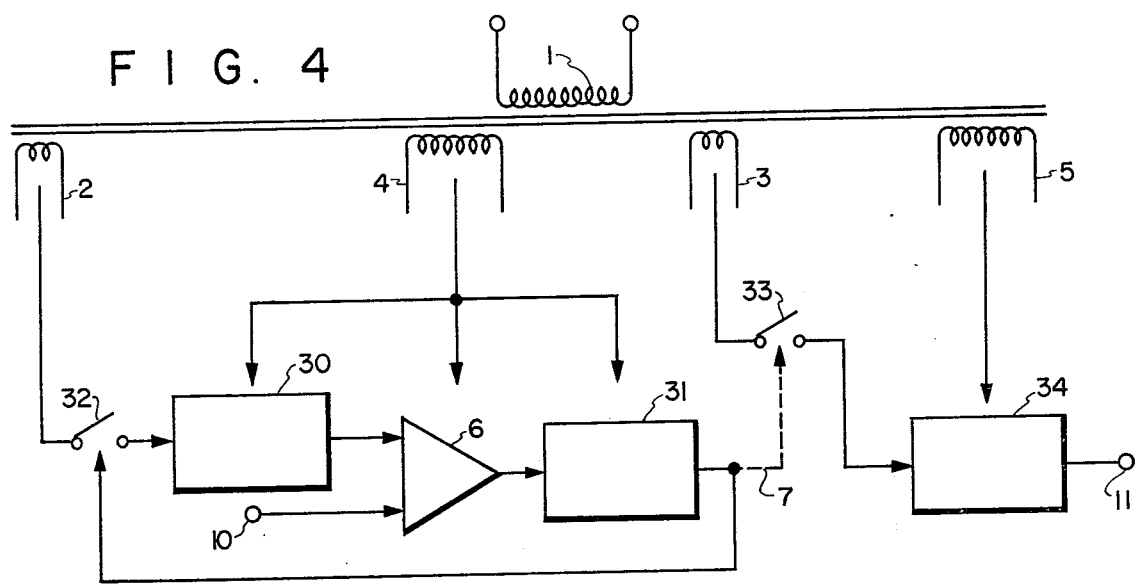
F I G. 4
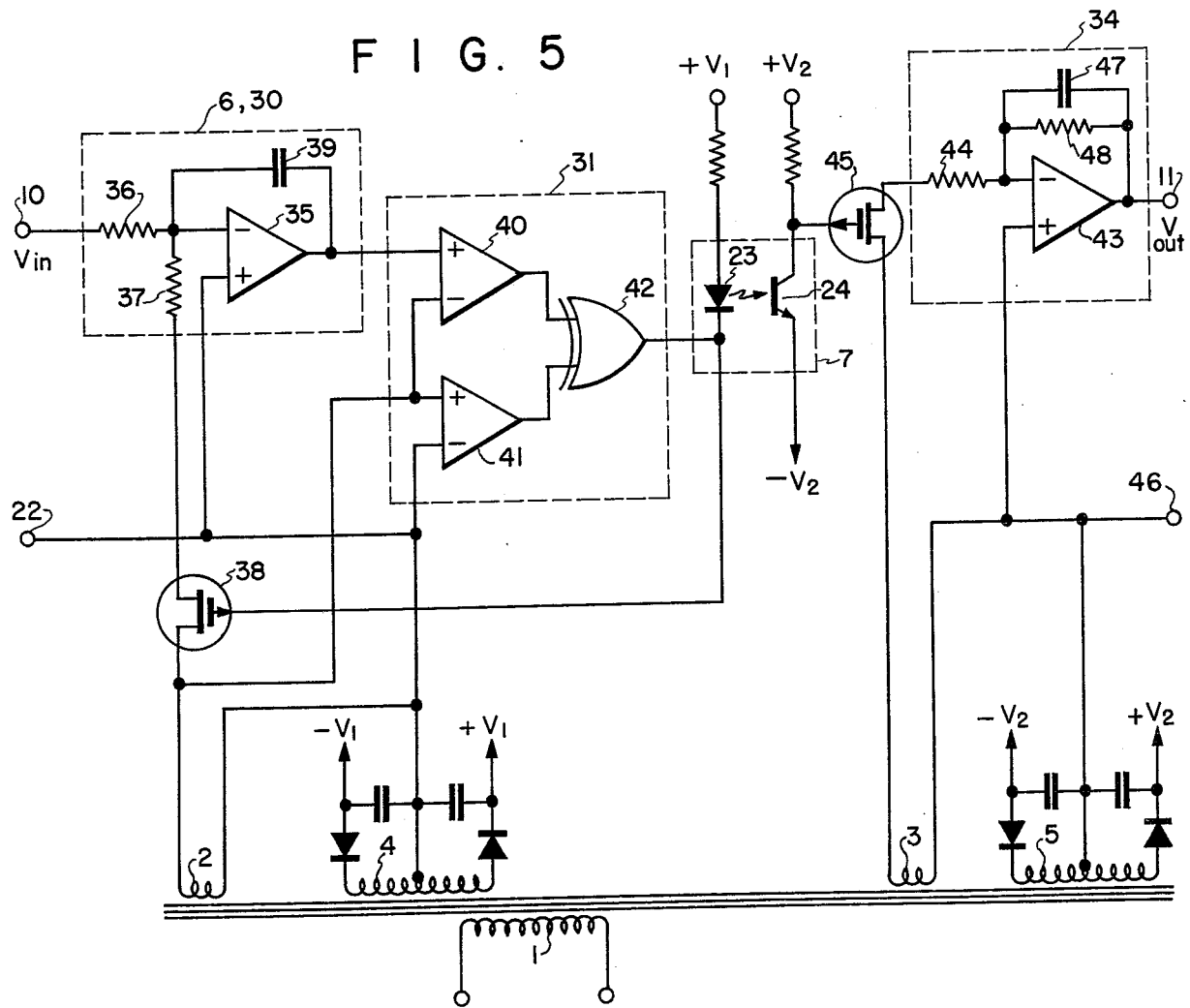
F I G. 5

ANALOG ISOLATOR

BACKGROUND OF THE INVENTION

1. Field of the Invention

The present invention relates to an isolator circuit and, more particularly, to an isolator circuit capable of providing conductive isolation for a direct current input signal.

2. Description of the Prior Art

Isolation circuits have heretofore been provided which have been relatively complex in nature, involving various signal choppers, modulators and transformers. Such circuits are shown, for example, in U.S. Pat. Nos. 2,832,848—Neff; 3,101,451—Burgarella et al; 3,581,184—Hurd; and 3,757,195—Sklaroff. Similarly, there have been provided isolating schemes using so-called optical isolators as represented by U.S. Pat. Nos. 3,488,586—Watrous et al and 3,794,841—Cosentino et al. As noted, these all involve relatively complex circuitry and components which render those techniques relatively expensive to make.

SUMMARY OF THE INVENTION

Accordingly, it is an object of the present invention to provide an analog isolator which is simple in structure and operation, which is highly accurate, which may be compactly and relatively inexpensively constructed.

In accomplishing these and other objects, there has been provided, in accordance with the present invention, an analog isolator featuring a single transformer which serves both as power supply transformer and as a signal transfer medium. The transformer includes a primary winding and four separate secondary windings. Two of the secondary windings are power-supply winding; one for the input circuit and one for the output circuit, thus maintaining conductive isolation of input and output circuits with respect to the power-supply. The other two secondary windings serve as signal transfer media; one for the input circuit and one for the output circuit. The A.C. energization from the signal transfer winding of the input circuit is compared with an unknown or input signal (which may be a variable D.C. signal). Control pulses are generated at each equality condition of the compared signals. The control signals are applied to control the actuation of an isolating coupler such as a so-called optical isolator. The energization of the isolating coupler, in turn, controls the selective gating of the A.C. energization from the signal transfer winding of the output circuit, thus developing an output signal which is an accurate, but isolated, representation of the input signal.

BRIEF DESCRIPTION OF THE DRAWINGS

A better understanding of this invention may be had from the following detailed description when read with reference to the accompanying drawings in which:

FIG. 1 is a simplified block diagram illustrating the principle of the present invention;

FIGS. 2a and 2b are a set of waveforms useful in the understanding of the present invention;

FIG. 3 is a schematic diagram of a circuit embodying the present invention;

FIG. 4 is a simplified block diagram illustrating the principle of another embodiment of the present invention;

FIG. 5 is a schematic diagram of a circuit embodying the present invention in accordance with the form generally illustrated in FIG. 4.

DETAILED DESCRIPTION

Figure 6:
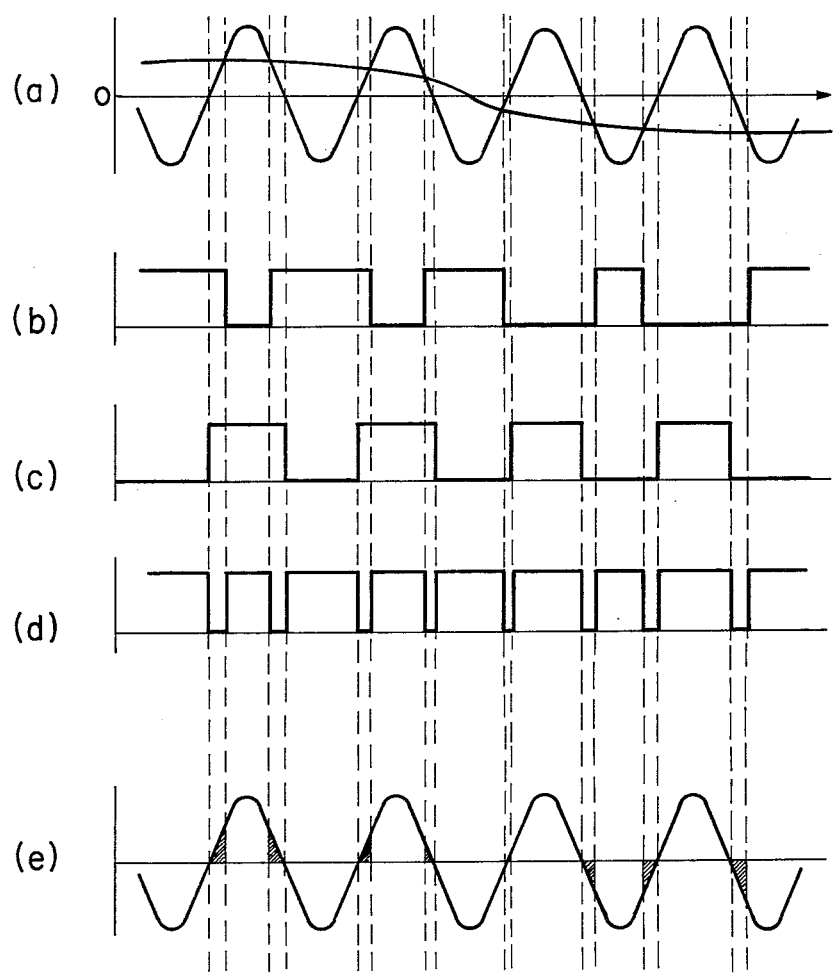
FIG. 6 is a series of waveform diagrams explanatory of the circuit of FIG. 5.

Referring now to the drawings in more detail, there is shown in FIG. 1 a transformer having a primary winding 1 adapted for connection to an A.C. power source. The transformer is provided with four secondary windings 2, 3, 4 and 5. Of these, the windings 4 and 5 comprise power-supply windings for the energization of the input circuit elements and the output circuit elements, respectively. The other two secondary windings 2 and 3 comprise means for effecting a transfer of intelligence signals from the input circuit to the output circuit. A comparator 6 in the input circuit is operated to actuate an isolating coupler 7, such as a so-called optical isolator. Actuation of the isolating coupler controls the operation of a switch means 8. The switch means 8, in turn, selectively controls the application of signals from the winding 3 to a sample-and-hold circuit comprising the output circuit of the apparatus. An unknown or input signal is applied to one input terminal of the comparator 6. The A.C. line signal from the secondary winding 2 is applied to the other input terminal of the comparator 6. In FIG. 2A the two signals are shown superimposed, with line (a) representing the unknown or input signal and the signal from the transformer secondary winding 2 represented by the line (b).

Whenever there is equality in the value of the two input signals, a pulse in produced which, when transmitted by the isolating coupler 7, effectively closes the switch means 8. The output circuit 9 includes a sample-and-hold circuit. The momentary closure of the switch means 8 applies the instantaneous value of the A.C. signal from the transformer secondary winding 3 to the sample-and-hold circuit 9. That instantaneous value is held until the next such pulse occurs at the next instant of equality between the two input signals when a new instantaneous value is sampled and held in the circuit 9. Since the circuit 9 is effectively the output circuit of the analog isolator comprising the present invention, the output signal is a multiple step signal composed of the sequence of sampled signals.

If the two secondary windings 2 and 3 are made to be identical with respect to number of turns, and polarity and both are wound on the same core, the A.C. signal induced in both windings 2 and 3 will be identical as to instantaneous amplitude and phase. Therefore, if a control pulse is produced from the input circuit 6 at the instant of equality between the A.C. signal from the transformer winding 2 and the unknown or input signal, the actuation of the sample-and-hold circuit 9 at that instant will cause a sampling of the A.C. signal from the secondary winding 3 at the instant when the value of that signal is also equal to the value of the input signal. Thus, there will be reconstructed an output signal which is a substantial replica of the input signal while maintaining conductive isolation between the input circuit and the output circuit. This reconstructed output signal is illustrated in FIG. 2B where curve (c) represents the signal induced in the winding 3 and curve (d) represents the sample-and-hold signals incident to the momentary actuation of the switch means 8.

In FIG. 3, there is illustrated a circuit embodying the principle of the present invention as represented by FIG. 1. In that figure, elements and components which are common to FIG. 1 bear the same reference numbers as the corresponding parts in FIG. 1. Thus, the transformer includes a primary winding 1 and four secondary windings 2, 3, 4 and 5. The input signal winding 2 has one terminal connected to an input circuit common lead 22. The other terminal of the winding 2 is connected, through a resistor 14, to the noninverting input terminal of an operational amplifier 12. The input terminal 10, to which an unknown or input signal is applied, is connected, through an input resistor 13, to the inverting terminal of the amplifier 12. A resistor 15 is connected between the noninverting input terminal of the amplifier 12 and the input common lead 22. A feedback resistor 16 is connected between the output terminal of the amplifier 12 and the inverting input terminal thereof.

The output terminal of the amplifier 12 is also connected, through a current limiting resistor 17 to one input terminal of a rectifying bridge which includes diodes 18, 19, 20 and 21, the output of the amplifier being connected to the junction between the diodes 18 and 19. The junction between the diodes 20 and 21, the other input terminal of the diode bridge, is connected to the input common lead 22, as is the center tap of the input circuit power supply circuit 4.

The output terminals of the diode bridge are connected across the terminals of a light emitting diode (LED) 23 which comprises the input portion of the isolating coupler, or optical isolator 7. The junction between the diodes 18 and 20 is connected to the anode of the LED 23 while the junction between the diodes 19 and 21 is connected to the cathode of the LED. The receiving portion of the optical isolator 7 is a photosensitive transistor 24 mounted to be responsive to the light emitted by the diode 23. The collector of the phototransistor 24 is connected to the positive terminal $+V_2$ of the output circuit power supply 5, while the emitter thereof is connected through a resistor 26 to the negative terminal $-V_2$ of the output power supply 5.

The junction between the emitter of the phototransistor 24 and the resistor 26 is connected to the gate electrode of a field effect transistor (FET) 25. The source electrode of the FET 25 is connected to one terminal of the output circuit signal winding 3. A shunt resistor 27 connects that terminal of the signal winding 3 to the other terminal thereof and to an output circuit common lead. The center tap of the output circuit power supply 5 is also connected to the output common lead. The drain electrode of the FET 25 is connected to the noninverting input of an amplifier 28. The inverting input of the amplifier 28 is directly connected to the output terminal 11 of that amplifier. A memory or HOLD capacitor 29 is connected between the drain electrode of the FET and the output common lead.

Whenever the input signal applied to the input terminal 10 is not equal to the instantaneous value of the A.C. signal applied from the transformer winding 2, there will be an output signal from the amplifier 12 applied through the resistor 17 to the input of the diode bridge. The polarity of that signal will depend upon which of the two input signals is greater. If the output signal from the amplifier 12 is positive, current will flow through the resistor 17, the diode 18, the LED 23 and the diode 21 to the input common lead 22. Under such conditions, the LED 23 will be excited to emit light. If the output signal from the amplifier 12 is negative in polarity, current will flow from the input common lead 22, through the diode 20, the LED 23, the diode 19 and the resistor 17. Under this condition, the LED 23 is also excited to emit light. On the other hand, whenever the input signal applied to the input terminal 10 is equal to the instantaneous value of the A.C. signal applied from the transformer winding 2, there will be effectively no signal output from the amplifier 12. With no signal from the amplifier 12, the LED is unenergized, therefore, unlit. Thus, whenever there is unequality between the two input signals, whatever the polarity, the LED 23 is excited to emit light; whenever there is a momentary equality between the two input signals, the LED 23 is momentarily extinguished.

Whenever the LED 23 is emitting light, the phototransistor is rendered conductive, producing a positive control signal at the gate electrode of the FET 25, holding the FET in a nonconductive state. When, however, the LED 23 is dark, a momentary negative pulse in applied to the gate of the FET 25, causing the FET to be momentarily conductive. The momentary conductivity of the FET 25 allows the capacitor 29 to be charged to the instantaneous value of the signal induced in the transformer secondary winding 3. Since, by design, the signal induced in the secondary winding 3 is identical with the signal induced in the winding 2, and since the FET 25 is rendered conductive only at the moment when the instantaneous value of the signal induced in the winding 2 is equal to the input signal, the signal value to which the capacitor 29 is charged is also equal to the value of the input signal. When the FET 25 is again rendered nonconductive, the charge remains on the capacitor 29 until it is changed by a subsequent triggering of the FET. That charge on the capacitor 29 comprises the input signal on the amplifier 28 which, in turn, provides an output signal at the output terminal 11 which is, effectively, a reconstruction of the signal applied to the input terminal 10. It may be seen, however, that the output circuit is conductively isolated from the input circuit.

In FIG. 4, there is illustrated the basic principle of a somewhat different structure also embodying the present invention. Again, there is presented a transformer having a primary winding adapted for connection to a conventional A.C. power source. The transformer also includes four secondary windings 2, 3, 4 and 5 corresponding in nature and purpose to the four windings described in connection with FIGS. 1 and 3. Input signals applied to the input terminal 10 are applied to one input terminal of a comparator amplifier 6. The signal secondary winding 2 is selectively connected, through an electronic switch 32, to a filter network 30, thence to the other input terminal of the comparator amplifier 6. The output of the comparator amplifier 6 is applied to a phase angle control or timing gate 31. The output of the gate 31 is simultaneously applied to control the operation of the switch 32 and, by way of an optical isolator 7, to control the operation of a similar electronic switch 33 in the output circuit. The filter 30 and the comparator amplifier 6 together form an integrator circuit. The output of the gate 31 is so arranged that the switch 32 is closed for selected intervals whereby the integral of the selected portions of the A.C. signal from the secondary winding 2 is equal to the value of the applied input signal. When the switch 33 in the output circuit is actuated simultaneously with the switch 32 of the input circuit, identical portions of the A.C. signal from the secondary winding 3 are selected and applied as input signal to an output integrator 34. The output of the integrator 34 applied to the output terminal 11 is a substantially exact reconstruction of the input signal applied to the input terminal 10 and is conductively isolated therefrom.

In FIG. 5, there is illustrated a circuit structure embodying the present invention in accordance with the principle generally set forth in FIG. 4. Here again, an input terminal 10 is connected through a resistor 36 to the inverting input of an amplifier 35; the noninverting input of the amplifier 35 is connected to an input common lead 22. The output of the amplifier 35 is connected by a capacitor 39 back to the inverting input of that amplifier. Here, too, there is provided a transformer having a primary winding 1 adapted for connection to an A.C. source. The transformer is again provided with four secondary windings 2, 3, 4 and 5; the windings 4 and 5 being separate power supply windings for the input and output circuits, respectively. The The secondary windings 2 and 3 comprise signal transfer media. In that respect, the signal winding 2 has one end thereof connected to the input common lead 22. The other end of the winding 2 is connected to the source electrode of a field effect transistor (FET) 38, the FET 38 corresponding to the switch 32 of FIG. 4. The drain electrode of the FET 38 is connected through a resistor 37 also to the inverting input of the amplifier 35.

The output of the amplifier 35 is directly connected to the noninverting input terminal of a first comparator amplifier 40. A lead from the junction between the source electrode of the FET 38 and the end of the signal winding 2 is connected to the inverting input of the comparator amplifier 40 as well as to the noninverting input of a second comparator amplifier 41. The inverting input of the comparator amplifier 41 is directly connected to the input common lead 22. Thus, the comparator 41 compares the line frequency signal from the transformer winding 2 with the fixed reference potential on the common lead 22 to produce output pulses at line frequency as shown at curve (c) of FIG. 6. The comparator 40, on the other hand, compares the signal from the transformer winding 2 with the output of the amplifier 35 to produce output pulses representative of the relative magnitude of the input signal as shown on curve (b) of FIG. 6.

The output signals from the two comparator amplifiers 40, 41 are applied, respectively, to the two input terminals of an exclusive -OR gate 42.

The gate 42 is arranged to produce a positive output signal whenever the signal applied to one of its input terminals is positive and the other negative. Whenever the signals applied to both input terminals of the gate 42 are alike, either positive or negative, the gate produces a negative or logical 0 output signal, as shown at curve (d) of FIG. 6. The output of the gate 42 is connected to the cathode of a light emitting diode (LED) 23, the anode of which is connected through a load resistor to the positive terminal of the input power supply represented by the transformer winding 4. The output of the gate 42 is also connected to the gate or control electrode of the FET 38.

The LED 23 comprises the input portion of an optical isolator 7, of which a phototransistor 24 comprises the output portion. The collector of the phototransistor is connected through a lead resistor to the positive terminal of the output power supply represented by the transformer winding 5. The emitter of the phototransistor is connected directly to the negative terminal of the output power supply 5. The collector of the phototransistor is also connected to the gate, or control electrode of a second field effect transistor (FET) 45. The FET 45 corresponds to the switch 33 shown in FIG. 4. The source electrode of the FET 45 is connected directly to one terminal of the output signal winding 3. The other terminal of the winding 3 is connected to an output common lead 46. The drain electrode of the FET 45 is connected, through a resistor 44 to the inverting input of an integrating amplifier 43. The noninverting input of the amplifier is connected directly to the output common lead 46. The output terminal of the amplifier 43 is connected by the parallel arrangement of a resistor 48 and a capacitor 47 in feedback relation to the inverting input terminal of the amplifier 43. The output terminal of the amplifier 43 is also connected to the isolator output terminal 11.

In FIG. 6, in addition to the curves (b), (c), and (d) noted above, there is shown curve (a) which illustrates the relationship between the A.C. signal induced in the transformer winding 2, a typical input signal $V_{in}$, and the reference potential of the common lead 22. Also shown is curve (e) which illustrates relative operation of the action of the switching FET's 38 and 45 with respect to the A.C. signal induced in the windings 2 and 3.

In operation, whenever the output of the gate 42 is high, or a logical 1, the FET 38 is cutoff. A signal applied to the input terminal 10 is integrated tending to produce a ramp output signal by the integrating amplifier 35. When that ramp signal, applied to the input of the first comparator 40, equals the instantaneous value of the A.C. signal applied to the other input of the comparator 40, the output of the comparator 40, changes state. Similarly, the comparator 41 changes state each time the A.C. signal from the winding 2 crosses the reference potential on the lead 22. As noted above, when the two output signals from the two comparators 40 and 41 are applied to the input of the gate 42, the gate 42 puts out a logical 0 whenever both inputs match, either both logical 1 or logical 0. On the other hand, when only one of the two input signals to the gate 42 is a logical 1, the output of that gate is a logical 1.

A logical 1 at the output of the gate 42 holds the FET 38 in a cutoff state, but a logical 0 renders the FET 38 conductive. As may be seen from the several curves of FIG. 6, there are short intervals when both of the inputs to the gate 42 are of the same state. It may also be seen that the duration of those intervals is a function of the absolute value of the input signal. The FET 38 is triggered into conduction, for example, when the comparator 41 changes to its "high" state while the comparator 40 is still in its "high" state. When the FET 38 is conductive, a portion of the A.C. signal induced in the winding 2 is applied to the input of the amplifier 35, through the resistor 37, in a direction to oppose the input signal. When the output of the amplifier is equal to the instantaneous value of the A.C. signal at the input of the comparator 40, that comparator changes state, turning off the FET 38. Later in the same half-cycle of the A.C. wave, the input signal again equals the instantaneous value of the A.C. signal, reversing the state of the comparator 40, thereby again triggering the FET 38 into conduction, to again sample a portion of the A.C. wave at the input of the amplifier. With this arrangement, the integrated value of the sampled portion of the A.C. wave is equal to the value of the input signal applied to the input terminal 10.

Simultaneously and synchronously with the on-off triggering of the FET 38, the FET 45 in the output circuit is also triggered on and off by the output signal from the gate 42 by way of the optical isolator 7. Thus, the triggering of the FET 45 causes identical portions of the identical A.C. wave to be sampled in the output circuit. Those identical sampled portions are applied as input signals to the output integrator 34. The output of that integrator will be substantially identical to the original input signal but will be conductively isolated therefrom. It will be appreciated that if the input signal applied to the input terminal 10 becomes negative with respect to the reference potential on lead 22, the sampled portions of the A.C. wave signal will be of the opposite phase relation and will, accordingly, produce an output signal which matches the input signal.

Thus, there has been provided an improved analog signal isolator which is simple in structure and operation, which is highly accurate, which may be compactly and relatively inexpensively constructed.

What is claimed is:

1. An analog isolator comprising:
   a transformer having a primary winding arranged for connection to an A.C. power source;
   a first and a second power supply secondary winding on said transformer;
   a first and a second signal secondary winding on said transformer;
   an input circuit arranged to be energized from said first power supply secondary winding;
   input signal terminal means connected to said input circuit;
   means coupling said first signal secondary winding to said input circuit;
   said input circuit including means for comparing input signals applied to said input terminal means with A.C. signals induced in said first signal secondary winding and for producing a control signal derived from such comparison;
   an output circuit arranged to be energized from said second power supply winding;
   gating means coupling said second signal secondary winding to said output circuit; and
   isolating coupling means for applying said control signal to control the operation of said gating means whereby to control the application of A.C. signals induced in said second signal secondary winding to said output circuit in accordance with said control signal;
   said output circuit being responsive to said controlled application of A.C. signals from said second signal secondary winding to produce an output signal representative of the input signal applied to said input terminal.

2. The analog isolator as set forth in claim 1 wherein said isolating coupling means comprises an optical isolator.

3. The analog isolator as set forth in claim 1 wherein said output circuit includes a sample-and-hold circuit.

4. The analog isolator as set forth in claim 1 wherein said input circuit includes phase angle selecting means whereby said control signal represents selected portions of a phase of the A.C. signal induced in said first signal secondary winding and said output circuit includes an integrator for integrating corresponding portions of A.C. signal induced in said second signal secondary winding.

* * * * *